(12) United States Patent
Simonelli et al.

(10) Patent No.: US 9,795,048 B2
(45) Date of Patent: Oct. 17, 2017

(54) MODULAR, SCALABLE, MULTI-FUNCTION, POWER QUALITY SYSTEM FOR UTILITY NETWORKS

(71) Applicant: Gridco Inc., Woburn, MA (US)

(72) Inventors: James Simonelli, Grafton, MA (US); Naimish Patel, Boston, MA (US); Jia Wu, Andover, MA (US)

(73) Assignee: Gridco Inc., Woburn, MA (US)

( * ) Notice: Subject to any disclaimer, the term of this patent is extended or adjusted under 35 U.S.C. 154(b) by 511 days.

(21) Appl. No.: 14/031,341

(22) Filed: Sep. 19, 2013

(65) Prior Publication Data

US 2015/0081131 A1    Mar. 19, 2015

(51) Int. Cl.
  *H05K 7/14*        (2006.01)
  *H05K 5/00*        (2006.01)
  *H02J 3/18*        (2006.01)

(52) U.S. Cl.
  CPC .......... *H05K 7/1432* (2013.01); *H02J 3/1814* (2013.01); *H05K 5/00* (2013.01); *H05K 7/14* (2013.01); *Y02E 40/18* (2013.01)

(58) Field of Classification Search
  CPC .................................. H05K 5/00; H05K 7/14
  USPC ......................................................... 307/151
  See application file for complete search history.

(56) References Cited

U.S. PATENT DOCUMENTS

| 4,419,619 | A | | 12/1983 | Jindrick et al. |
| 5,283,726 | A | * | 2/1994 | Wilkerson .......... H02M 1/4233 323/207 |
| 5,383,090 | A | * | 1/1995 | Freundner ........... H01R 4/5091 174/68.2 |

(Continued)

FOREIGN PATENT DOCUMENTS

| WO | 2010000315 A1 | 1/2010 |
| WO | 2011124223 A2 | 10/2011 |
| WO | WO 2013/000512 A1 | 1/2013 |

OTHER PUBLICATIONS

International Searching Authority, Written Opinion for International Application No. PCT/US2014/054532, dated Dec. 18, 2014, 10 pgs.

(Continued)

*Primary Examiner* — Adi Amrany
(74) *Attorney, Agent, or Firm* — Iandiorio Teska & Coleman, LLP (57) ABSTRACT

A modular, scalable, multi-function, power quality system provides a modular and scalable power conditioning system for utility networks. A configurable frame is coupled to an electrical input and an electrical output. A plurality of functional slots each including a receiving connector are coupled to the frame. One or more unique function subsystems are coupled to selected functional slots. Each unique function subsystem includes one or more electrical components coupled to the receiving connector of selected functional slots configured to define functional capability associated with the one or more functional slots. A plurality of identical power modules are disposed in selected functional slots of each of the one or more unique function subsystems. A controller coupled to each of the power modules is configured to enable the power modules in predetermined functional slots of the one or more unique subsystems to perform a predetermined function associated with the electrical input or the electrical output.

32 Claims, 7 Drawing Sheets

(56) References Cited

U.S. PATENT DOCUMENTS

| | | | |
|---|---|---|---|
| 5,548,203 A * | 8/1996 | Kemerer | H02J 3/1864 323/208 |
| 6,075,350 A | 6/2000 | Peng | |
| 6,134,124 A * | 10/2000 | Jungreis | H02J 3/32 363/34 |
| 6,191,676 B1 * | 2/2001 | Gabor | H02M 1/4225 336/160 |
| 6,327,162 B1 | 12/2001 | Larsen et al. | |
| 6,404,348 B1 | 6/2002 | Wilfong | |
| 6,738,692 B2 | 5/2004 | Schienbein et al. | |
| 6,861,943 B2 * | 3/2005 | Pike | G06F 1/20 340/3.9 |
| 6,917,227 B1 | 7/2005 | Ochi | |
| 7,209,477 B2 * | 4/2007 | Pike | H04L 49/351 370/360 |
| 7,532,490 B2 | 5/2009 | Datta et al. | |
| 8,244,406 B2 | 8/2012 | Momoh | |
| 2003/0058618 A1 * | 3/2003 | Soetemans | H05K 7/1459 361/688 |
| 2005/0170678 A1 * | 8/2005 | Donahue | H01R 13/514 439/214 |
| 2007/0242413 A1 * | 10/2007 | Drugge | H01G 4/224 361/301.3 |
| 2010/0019742 A1 * | 1/2010 | Li | H02M 7/53871 323/234 |
| 2010/0290186 A1 * | 11/2010 | Zeng | H05K 7/20545 361/694 |
| 2012/0016531 A1 | 1/2012 | Ganev et al. | |
| 2012/0169300 A1 * | 7/2012 | Rouaud | H02J 3/1835 323/207 |
| 2012/0310434 A1 | 12/2012 | Taft | |
| 2013/0099565 A1 | 4/2013 | Sachs et al. | |
| 2013/0121051 A1 | 5/2013 | Weiss et al. | |
| 2013/0322016 A1 * | 12/2013 | Jones | H05K 7/1432 361/689 |
| 2014/0254223 A1 * | 9/2014 | Limpaecher | H02M 7/4826 363/126 |

OTHER PUBLICATIONS

Ohrtishi et al., "Utility Power Quality Control by Using a Three Phase Inverter Module", IEEE, 2007, pp. 3073-3078.

* cited by examiner

MODULAR, SCALABLE, MULTI-FUNCTION, POWER QUALITY SYSTEM FOR UTILITY NETWORKS

FIELD OF THE INVENTION

This invention relates to a modular, scalable, multi-function, power quality system for utility networks.

BACKGROUND OF THE INVENTION

Ideally, the power generated and delivered by electrical utility grid network would have pure sine wave shapes. However, such an idealized electrical utility grid network does not exist. As a result, reinforcing feedback exists where electrical loads draw non-ideal sine waves of current which in turn distorts the shape of the supply voltage waves which further erodes the current wave shape drawn by the loads.

Numerous conventional power quality systems, e.g., uninterruptible power supplies (UPS), power conditioners, active harmonic cancelation systems, harmonic traps, transformer tap chargers, capacitor banks, static VAR compensators, unified power flow controllers, and the like, operate with passive filters, power electronics, and/or a combination of both to improve either the voltage or current waveforms delivered to or from electrical loads. Such conventional power quality systems typically tend to isolate disturbances from the supply voltage or electrical load currents.

Many conventional power quality systems, e.g., tap changers and surge suppressors, have a single function and are designed to improve only one dimension of power quality provided by the electrical utility grid, such as RMS voltage variations or high voltage spikes induced by lightning. Some conventional power quality systems may provide multiple functions in a single device. Examples may include UPSs, Static VAR Compensators, and Unified Power Flow Controllers. Other conventional power quality systems may provide modularity and scalability to allow the systems to scale in size from low to higher power with the same building blocks, e.g., scalable UPSs.

Electrical utility distribution networks often need to scale power processing by functional dimension in addition to just scaling the input to output power capacity rating. For example, often more power processing is needed for voltage regulation than harmonic cancelation or power factor improvement. Thus, electrical utility grids are forced to either purchase multiple single-function power quality system or to purchase a multi-function power quality system that is often oversized for two or more of the required functions. This leads to higher costs for the utility companies and ultimately higher utility bills for consumers. To date, no known conventional power quality system can address such a need faced by electrical utility grids.

SUMMARY OF THE INVENTION

In one aspect, a modular, scalable, multi-function, power quality system for utility networks is featured. The system includes a configurable frame coupled to an electrical input and an electrical output. A plurality of functional slots each including a receiving connector are coupled to the frame. One or more unique function subsystems are coupled to selected functional slots. Each unique function subsystem includes one or more electrical components coupled to the receiving connector of selected functional slots configured to define functional capability associated with the one or more functional slots. A plurality of identical power modules are disposed in selected functional slots of each of the one or more unique function subsystems. A controller coupled to each of the power modules is configured to enable the power modules in predetermined functional slots of the one or more unique subsystems to perform a predetermined function associated with the electrical input or the electrical output.

In one embodiment, at least one of the unique function subsystems may be configured as a pre-charger module for pre-charging a DC bus for each of the plurality of identical power modules and for providing isolation. The pre-charger subsystem may include at least a coil, a contact, a plurality of switches, and a resistor. At least one of the unique function subsystems may be configured as a VAR injector filter module configured to provide clean power to the electrical input. The VAR injector filter module may be configured to provide input harmonic current cancellation. The VAR injector filter module may include a filter. The system may include a capacitive bank subsystem coupled to the VAR injector filter module configured to provide additional capacitance needed for VAR injection. At least one of the unique function subsystems may include a power filter regulation module configured to provide regulated voltage to the electrical output. The power filter regulation module may be configured to provide output voltage harmonic cancellation. The power filter regulation module may include an inductor and a capacitor configured as a filter. The system may include a series injector module configured to inject regulator voltage to the output electrical port to provide power regulation and provide bypass protection during an overload or failure of the system. The series injector module may include at least a silicone-controlled rectifier (SCR), a transformer, and a plurality of switches. The plurality of power modules may include an output connector configured to connect to the receiving connector of a selected functional slot. The controller may be configured to sense the functional capability associated with each of the one or more unique functional subsystems. The controller may be configured to sense DC bus voltage of each of the power supply modules. The controller may be configured to sense the current in each of the power modules. The controller may be configured to sense the current from the electrical input. The controller may be configured to sense the current from the electrical output. The controller may be configured to sense the voltage from the electrical input. The controller may be configured to sense the temperature of the system. The controller may be configured to control selected power modules to perform VAR injection. The controller may be configured to control selected power modules to perform harmonic current cancellation. The controller maybe configured to control selected power modules to perform voltage regulation. The controller may be configured to control selected power modules to perform harmonic voltage cancellation. Each of the identical power modules may include a plurality of gate drives coupled to a plurality of switching transistors responsive to signals from the controller. The controller may be configured to generate control signals to each of the power modules to activate predetermined switching transistors of the power modules. The control signals may include pulse wave modulation (PWM) signals. The controller may be configured to generate control signals to control and define the one or more unique function subsystems. The control signals may include pulse wave modulation (PWM) signals. The selected components comprising unique subsystems may be located on the one or more of the identical power modules.

In one aspect, a modular, scalable, multi-function, power quality system for utility networks is featured. The system includes a configurable frame coupled to an electrical input and an electrical output. A plurality of functional slots each including a receiving connector are coupled to the frame. A VAR injector filter module coupled to selected functional slots including one or more electrical components coupled to the receiving connector of selected functional slots is configured to provide clean power to the electrical input. A plurality of identical power modules are disposed in selected functional slots of the VAR injector filter module. A controller coupled to each of the power modules is configured to enable the power modules in predetermined functional slots of the VAR injector filter module to provide clean power to the electrical input.

In another aspect, a modular, scalable, multi-function, power quality system for utility networks is featured. The system includes a configurable frame coupled to an electrical input and an electrical output. A plurality of functional slots each including a receiving connector are coupled to the frame. A power filter module including one or more electrical components coupled to the receiving connector of selected functional slots is configured to provide filtered voltage to the electrical output. A plurality of identical power modules are disposed in selected functional slots of the power filter module. A controller coupled to each of the power modules is configured to enable the power modules in predetermined functional slots of the power filter module to provide filtered voltage to the electrical output.

In yet another aspect, a modular, scalable, multi-function, power quality system for utility networks is featured. The system includes a configurable frame coupled to an electrical input and an electrical output. A plurality of functional slots each including a receiving connector is coupled to the frame. A VAR injector filter module coupled to selected functional slots including one or more electrical components coupled to the receiving connector of selected functional slots is configured to provide clean power to the electrical input. A power filter module coupled to selected functional slots including one or more electrical components coupled to the receiving connector of selected functional slots is configured to provide filtered voltage to the electrical output. A plurality of identical power modules are disposed in selected functional slots of each of the VAR injector filter module and the power filter module. A controller coupled to each of the power modules is configured to enable the power modules in predetermined functional slots of the VAR injector filter module and the power filter module to provide clean power to the electrical input and filtered voltage to the electrical output.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
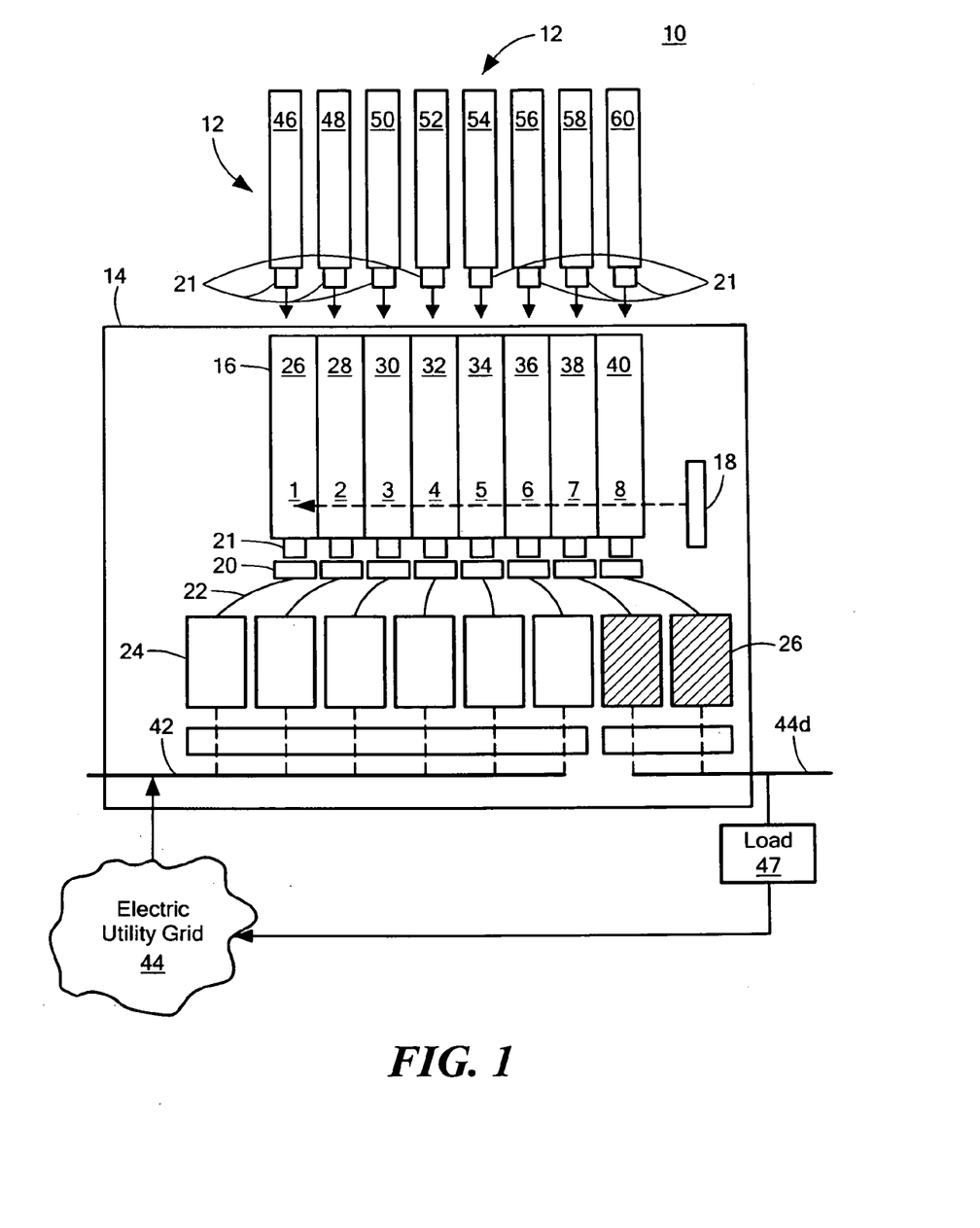
FIG. 1 is a schematic block diagram showing the primary components of one embodiment of the modular, scalable, multi-function, power quality system for utility networks of this invention.

There is shown in FIG. 1 one embodiment of modular, scalable, multi-function, power quality system 10 for utility networks of this invention. System 10 includes configurable frame 14 coupled to electrical input 42 and electrical output 46. Electrical input 42 and electrical output 46 are coupled to electrical utility grid 44. Frame 14 houses the various components of system 10 and provides protection from the user from electrical shock.

System 10 also includes a plurality of functional slots 16 each preferably including receiving connector 20 coupled to frame 14. The number of functional slots 16 in frame 14 is preferably defined by the customer based on the customer's specific modularity and functional needs. In this example, frame 14 includes eight functional slots 26, 28, 30, 32, 34, 36, 38, and 40 each having a receiving connector 20 coupled thereto.

System 10 also includes one or more unique function subsystems coupled to selected functional slots 16. In this example, there are two unique function subsystems 24 and 26, although system 10 may have more or less than two functional subsystems as defined by the customer's requirements. Each unique function subsystem 24, 26 includes one or more electrical components coupled to receiving connector 20 of selective functional slots 16 configured to define the functional capability associated with functional slots 16, as will be discussed in further detail below.

System 10 also includes a plurality of identical power modules 12 disposed in selected functional slots 16 of each of the one or more unique function subsystems. Identical power modules 12 are configured to provide multiple functions depending on which functional slot they are inserted. The number of functional slots 16 in frame 14 is defined by the customer based on the customer's specific modularity and functional needs. Each of power modules 12 include at least connector 21 configured to connect to a selected receiving connector 20. In this example, identical power modules 46, 48, 50, 52, 54, and 56 are connected by their respective connector 21 to receiving connector 22 of functional slots 26, 28, 30, 32, 34, and 36 respectively of unique function subsystem 24. Similarly, identical power modules 58 and 62 are connected to functional slots 38 and 40 of unique function subsystem 26. Receiving connectors 20 are mounted in frame 14 and couple the power and control signals from power modules 12 in functional slots 16 of the one or more unique function subsystems 24 and 26 to frame 14. Receiving connectors 20 of functional slots 16 can be mounted on a back plane or can be individual connectors mounted in frame 14. In one example, slot wiring 22 couples receiving connector 20 to unique function subsystem 24 and unique function subsystem 26 as shown.

Controller 18 is coupled to each of power modules 12 and is configured to enable power modules 12 in the functional slots of the unique function subsystems to perform a pre-determined function associated with electrical input 42 or electrical output 44. Functional slots 16 are the physical locations that provide interface between power modules 12 and frame 14. Functional slots 16 couple the control signals from controller 18 to power modules 12 enabling power modules 12 to process the appropriate power and function.

As will be discussed in detail below, unique function subsystem 24, 26 include all the necessary components to provide the unique function and personality to the appropriate functional slots 16. Controller 18 controls the function of each of power module 12 in a manner consistent with their functional slot. Controller 18 is a system specific configuration that determines what slot forms what function at the time of assembly.

Input electrical port 42 is a means of connecting system frame 14 to electrical power grid 44. In this example, only one input electrical port 42 is shown, however, in other designs there may be multiple electrical ports 42.

In one example, unique function subsystem 24 includes the necessary electrical components, such that when identical power modules 46, 48, 50, 52, 54, and 56 are connected into functional slots 26, 28, 30, 32, 34, and 36 respectively, controller 18 will cause power module 46, 48, 50, 52, 54 and 56 to perform a desired predetermined function associated with input electrical port 42, e.g., voltage-ampere reactive (VAR) injection.

Figure 2:
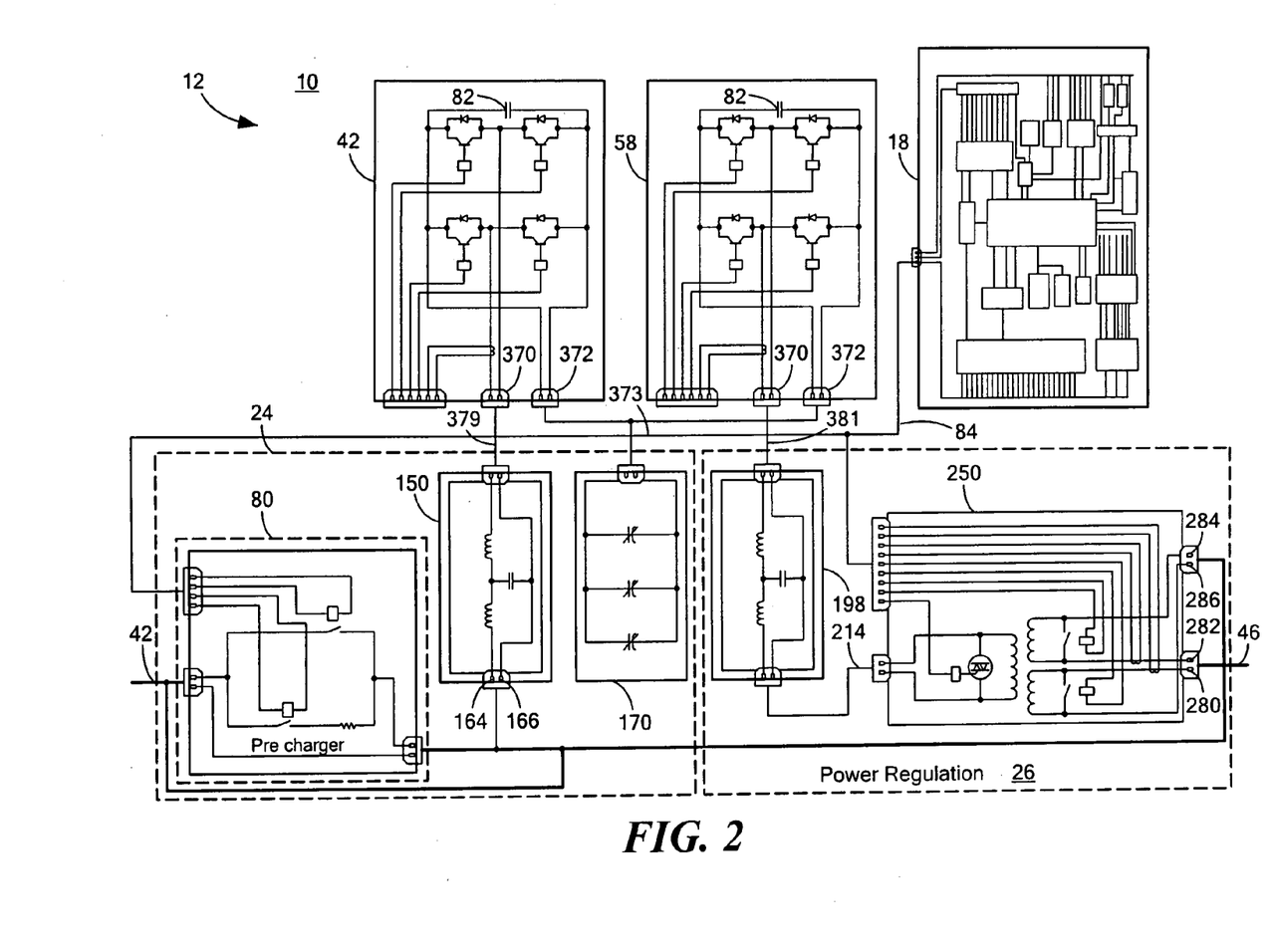
FIG. 2 is a circuit diagram of one embodiment of the modular, scalable, multi-function, power quality system shown in FIG. 1 showing in further detail the primary components of exemplarily unique function subsystems of this invention.
Figure 3:
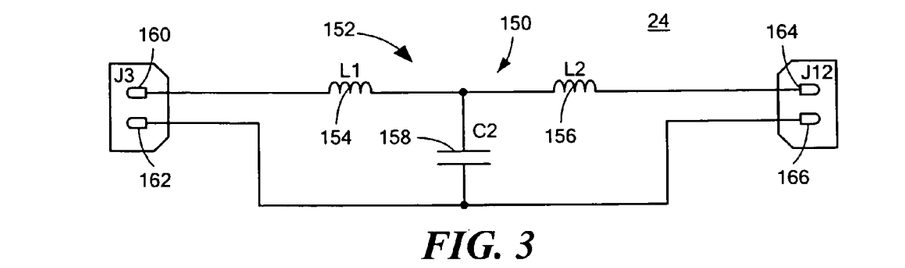
FIG. 3 is a circuit diagram showing one example of a unique function subsystem configured as a VAR injector filter module.

For example, unique function subsystem 24 may be configured as VAR injector filter module 150, FIG. 2 to provide clean power to electrical input 42. In this design, VAR injector filter module 150, FIGS. 2 and 3, preferably include includes filter 152, FIG. 3, comprised of inductors 154, 156, and capacitor 158.

Figure 8:
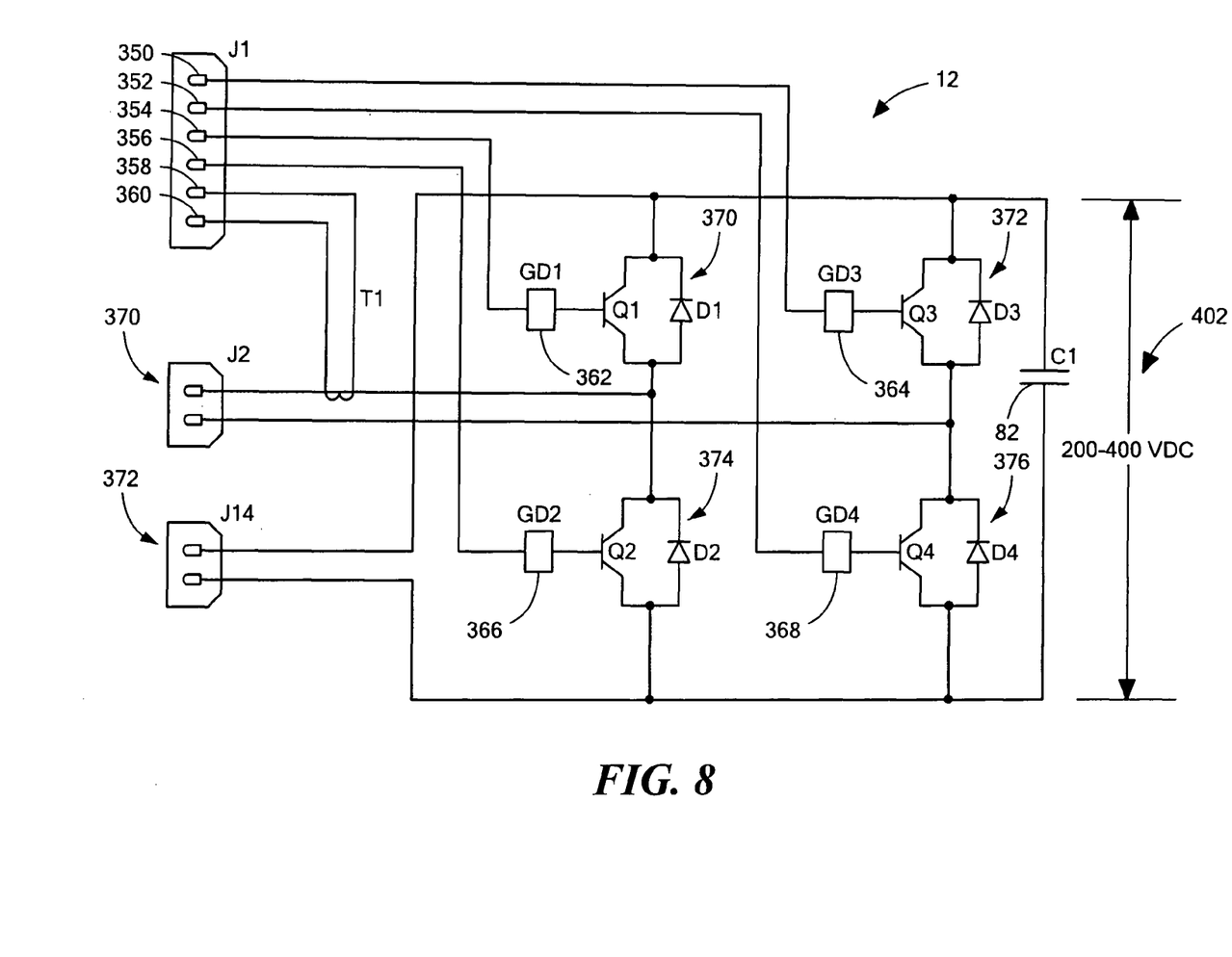
FIG. 8 is a circuit diagram showing in further detail one example of then identical power module shown in FIGS. 1 and 2.

In this example, PWM control signals output by controller 18, FIG. 2, by line 84, are input selected power modules 12, e.g., power module 46, as shown, as well as selected power modules 48-56, FIG. 1, at nodes 350, 352, 353, and 354, FIG. 8, exemplary power module 12 in a manner to transfer bi-directional real and reactive power between input electrical port 42, FIG. 2, and capacitor bank sub-system 170 via power connector 370, FIG. 8. The detailed operation of power module 12, FIG. 8, is discussed below. The bi-directional real and reactive power flow between electrical input port 42, FIG. 2, and power connector 370, FIG. 8, has many harmonics that are filtered out by the VAR injector filter module 150, FIG. 2, to ensure energy coupled to electrical input port 42 is sinusoidal with suitably low harmonic content to provide clean power to electrical input 47. Additionally, VAR injector filter module 150 may provide input harmonic current cancellation to electrical input 42 when controller 18 modulates the PWM control signals to the selected power modules 46, 48, 50, 52, 54, and 56 such that controller 18 cancels harmonic currents which may flow between the grid 44 and load 47.

Figure 4:
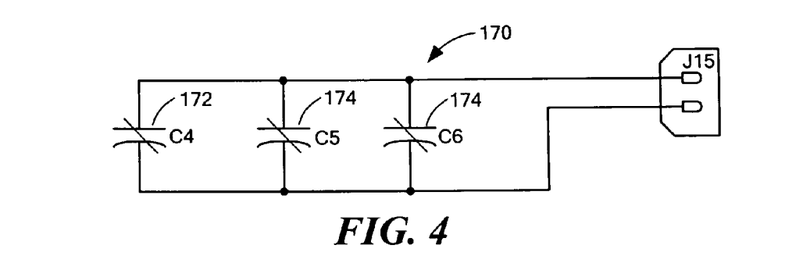
FIG. 4 is a circuit diagram showing one example of a capacitive bank which may be coupled to the VAR injector filter module shown in FIG. 3 to provide additional capacitance for VAR injection.

Preferably, capacitive bank subsystem 170, FIGS. 2 and 4, is coupled to VAR injector filter module 150. Capacitive bank subsystem 170, FIG. 4, preferably includes a plurality of capacitors, e.g., 170, 172, 174, and 176, FIG. 4, which provide additional capacitance needed for VAR injection.

Figure 5:
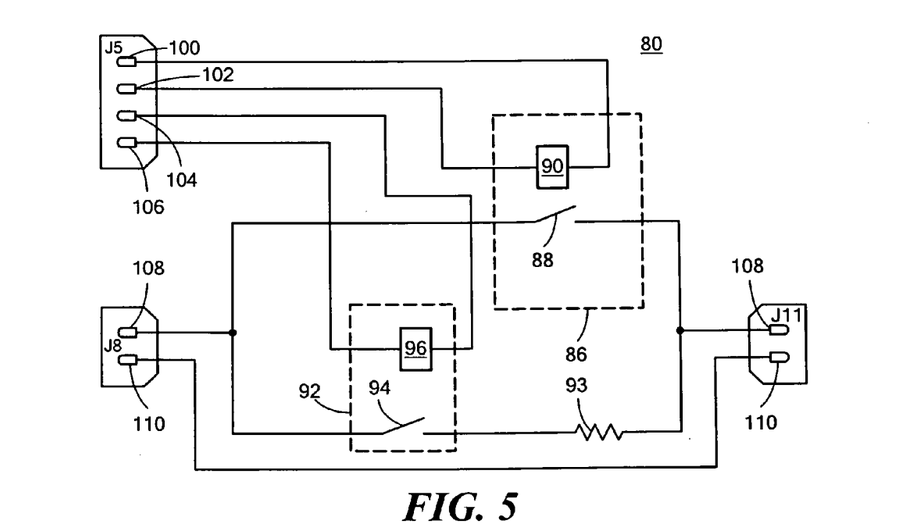
FIG. 5 is a circuit diagram showing one example of a unique function subsystem configured as a pre-charger module.

In another example, unique function subsystem 24, FIG. 1, may be configured as a pre-charger module 80, FIG. 2, for pre-charging a DC bus of each of the plurality of identical power modules, e.g., DC bus 82, of identical power modules 12 (shown in greater detail in FIG. 8). In this example, pre-charger module 80, FIG. 5, preferably includes contactor 86 comprised of switch 88 and control coil 90 and contact 92 comprised of switch 94 with control coil 96. Pre-charger module 80 also includes resistor 93. Pre-charger module 80, FIGS. 2 and 5, receives control signals, e.g., coil drive signals, from controller 18 by line 84, which are input at nodes 100, 102, 104, and 106, FIG. 5, to control contactors 86 and 92. Contactor 86 opens or closes switch 88 and contractor 92 opens or closes switch 94. In operation, when switches 88 and 94 are open, pre-charger module 80 provides power isolation. When switch 94 is closed and switch 88 is open, pre-charger module 80 pre-charges DC buses 80, FIG. 2, of identical power modules 12. Nodes 108 and 110, FIG. 5, are coupled to electrical input 42, FIG. 2, which is coupled to electrical utility grid 44, FIG. 1. When switches 88 and 94, FIG. 5, are closed, bi-directional power flow can be enabled between DC buses 80, FIG. 2, of identical power modules 12 and electrical input 42 without pre-charge resistor 93, FIG. 5, consuming losses.

Unique function circuit subsystem 26, FIG. 1, is similar to unique function circuit subsystem 24 but include different components such that when identical power modules 58, 60 are connected into functional slots 38 and 40, controller 18 will cause power modules 38, 40 to perform a different desired predetermined function associated with output electrical port 46 connected to electrical load 47, e.g., power regulation.

Figure 6:
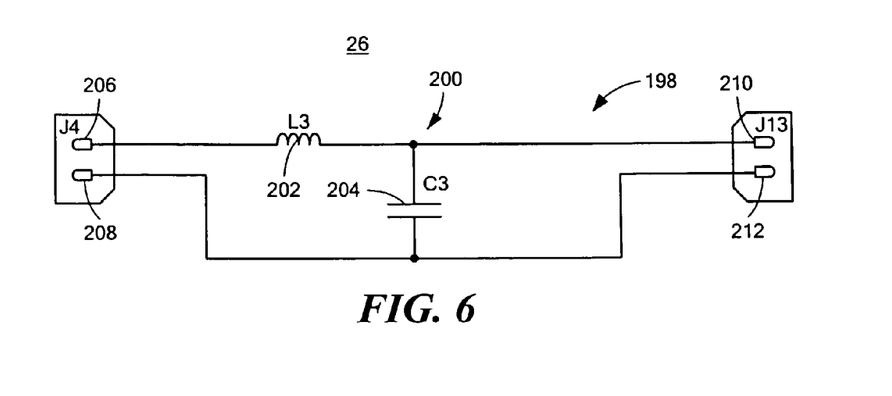
FIG. 6 is a circuit diagram showing one example of a unique function subsystem configured as a power regulation filter module.

For example, unique function subsystem 26, FIGS. 1 and 2, may be configured as power regulation filter module 198. In one design, power regulation filter module 198, FIGS. 2 and 6, include filter 200, FIG. 6, having inductor 202 and capacitor 204. In this example, the PWM control signals output by controller 18, FIG. 2, by line 84, are input selected power modules 12, e.g., to power module 58, as shown, as well as power module 60, FIG. 1 at nodes 350, 352, 353, and 354, FIG. 8, of exemplary power module 12 in a similar manner discussed above to transfer bi-directional real and reactive power capacitor bank sub-system 170 and electrical output port 46 via power connector 370, FIG. 8. The bi-directional real and reactive power flow between electrical output port 46, FIG. 2 and power connector 370, FIG. 8 has many harmonics that are filtered out by the power regulation filter module 198, FIGS. 2 and 6, to ensure energy coupled to electrical output port 46 is sinusoidal with suitably low harmonic content to provide filtered voltage to electrical output 46. The un-filtered bi-directional real and reactive power flow are input at nodes 206 and 208, FIG. 6, and the filtered power provided by filter 200 of power regulation filter module 198 is output at nodes 210, 212, which are coupled to electrical output 46, FIG. 2, by line 214. Additionally, power regulation filter module 198 may provide output voltage harmonic cancellation to electrical output 46 when controller 18 modulates the PWM signals to power modules 58, 60 in a manner to cancel harmonic voltage distortion that may be present on the grid 44 from being presented to the load 47.

Figure 7:
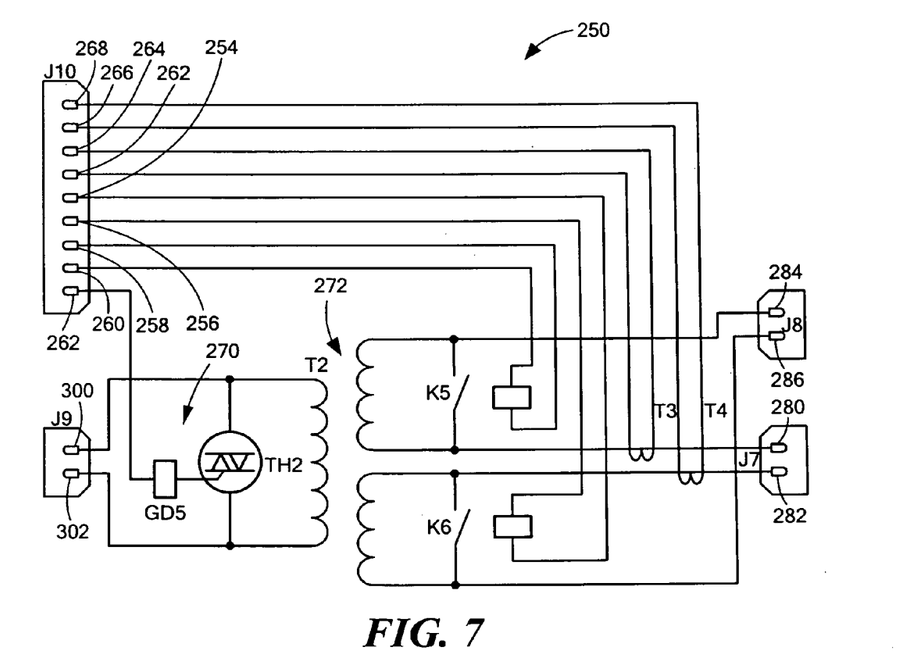
FIG. 7 is a circuit diagram showing one example of a unique function subsystem configured as a series injector module.

Unique function subsystem 26, FIGS. 1 and 2, for power regulation system may also include series injector module 250, FIG. 2, configured to inject regulator voltage to electrical output 46 to provide power regulation and provide by-pass protection during an overload or failure of system 10. FIG. 7 shows a more detailed view of series injector module 250. In this example, control signals from controller 18, FIG. 2, by lines 84, are input at nodes 254, 256, 258, 260, and 262, FIG. 7. Current signals are output at nodes 262, 264, 266, and 268 by series injector 250 connected to lines 84, FIG. 2, and sensed by controller 18. Series injector module 250 preferably includes silicon-controlled rectifier (SCR) 270 and transformer 272 which provides series voltage injection which is output at nodes 280, 282 to electrical output 46 as shown in FIG. 2. The input voltage from electrical input 42 is input at nodes 284, 286, FIGS. 2 and 7. The determined regulated voltage output by power regulation filter module 198, FIG. 2 of unique function subsystem 26 is input at nodes 300, 302.

Preferably, each of the identical power modules 12, FIGS. 1 and 2, includes a plurality of gate drives coupled to a plurality of switching transistors responsive to PWM control signals from the controller. For example, FIG. 8 shows in further detail one example of a single power module 12 which is identical to all the power modules in the system, e.g., power modules 46-60, FIG. 1. In this example, power module 12 includes gate drives 362, 364, 366, and 368, coupled to switching transistors 370, 372, 374, and 376, respectively. Preferably, switching transistors 370, 372, 374, and 376 are insulated gate bi-polar transistors (IGBT) or similar type switching transistors. In the example shown in FIG. 2, power modules 12 receive PWM signals from controller 18 by line 84. The PWM control signals on line 84 are input to power module 12, FIG. 8, at nodes 350, 352, 354 and 356. Output signals generated by power module 12 are output at nodes 358, 360 are input to and sensed by controller 18, FIG. 2, by line 84 as shown. Power port 372, FIGS. 2 and 8, may be coupled to other identical power modules by line 373, FIG. 2, as shown. Power port 370, FIGS. 2 and 8 of power module 12 may be coupled to VAR injector module 150 by line 379 as shown. Power port 370, FIGS. 2 and 8 of a different power module 12 may be coupled to power regulation filter module 198 by line 381 as shown. Power module 12 is typically coupled to 200 to 400 VDC, indicated at 402.

Controller 18, FIGS. 1 and 2, is preferably configured to sense the functional capability associated with each of the unique functional subsystems. As discussed above, controller 18, FIG. 1, is configured to generate PWM signals to each of the power modules to activate one or more of gate drives 362, 364, 366, and 368, FIG. 8, to turn on or off switching transistors 370, 372, 374, and 376 to define the functional capability of the functional slots of the unique function subsystems as discussed above.

FigsFIGS. 9A-9B showsshow one example of controller 18. In this example, controller 18 includes analog conditioning circuit 400 responsive to inputs 402. Analog conditioning circuit 400 provides input to ADC and multiplexor 404. Controller 18 also preferably includes microprocessor 408, e.g., a DSP chip or similar type chip, and PWM logic circuit 412. PWM logic circuit 412 provides the PWM signals discussed above to the various power modules, in this example, indicated by power card 1, power card 2, power card 3, power card 4, power card 5, power card 6, power card 7, and power card 8, corresponding to the plurality of power modules 46-60, FIG. 1. The PWM output signals are output by line driver interface 414 by line 416 which is output at node 418 to power modules 12, e.g., via nodes 350-356 discussed above with reference FIG. 8. Controller 18 also preferably includes digital input/output (I/O) buffer driver 450 which provides I/O signals by line 452 which is coupled to line 454 and output at node 456. These I/O signals connect to at least nodes 102-108, FIG. 5, of pre-charger 80. Node 470, FIG. 10, of controller 18, receives input from various unique function subsystems discussed above with reference to one or more of FIGS. 1-9. Thus, controller 18, FIGS.

Figure 9A:
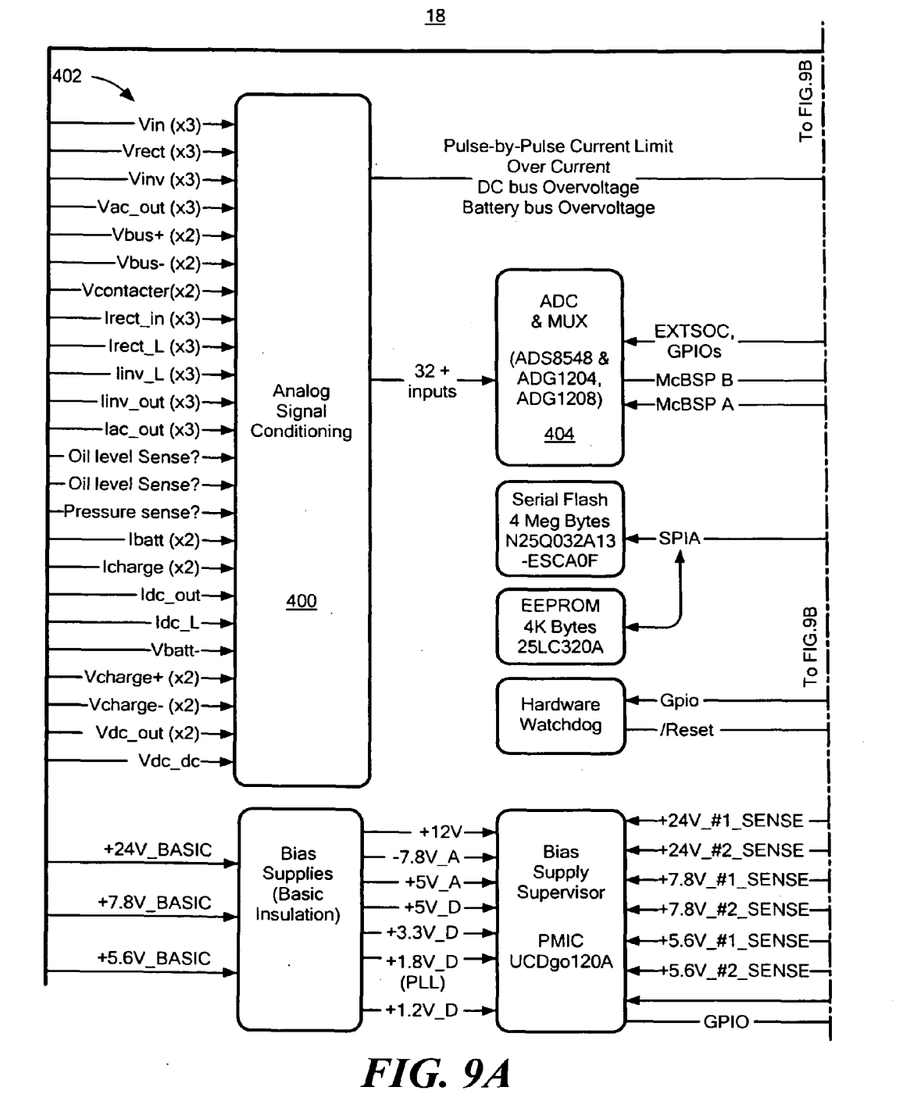
FIGS. 9A-9B isare a schematic block diagram showing the primary components of one embodiment of the controller shown in FIGS. 1 and 2.
Figure 9B:
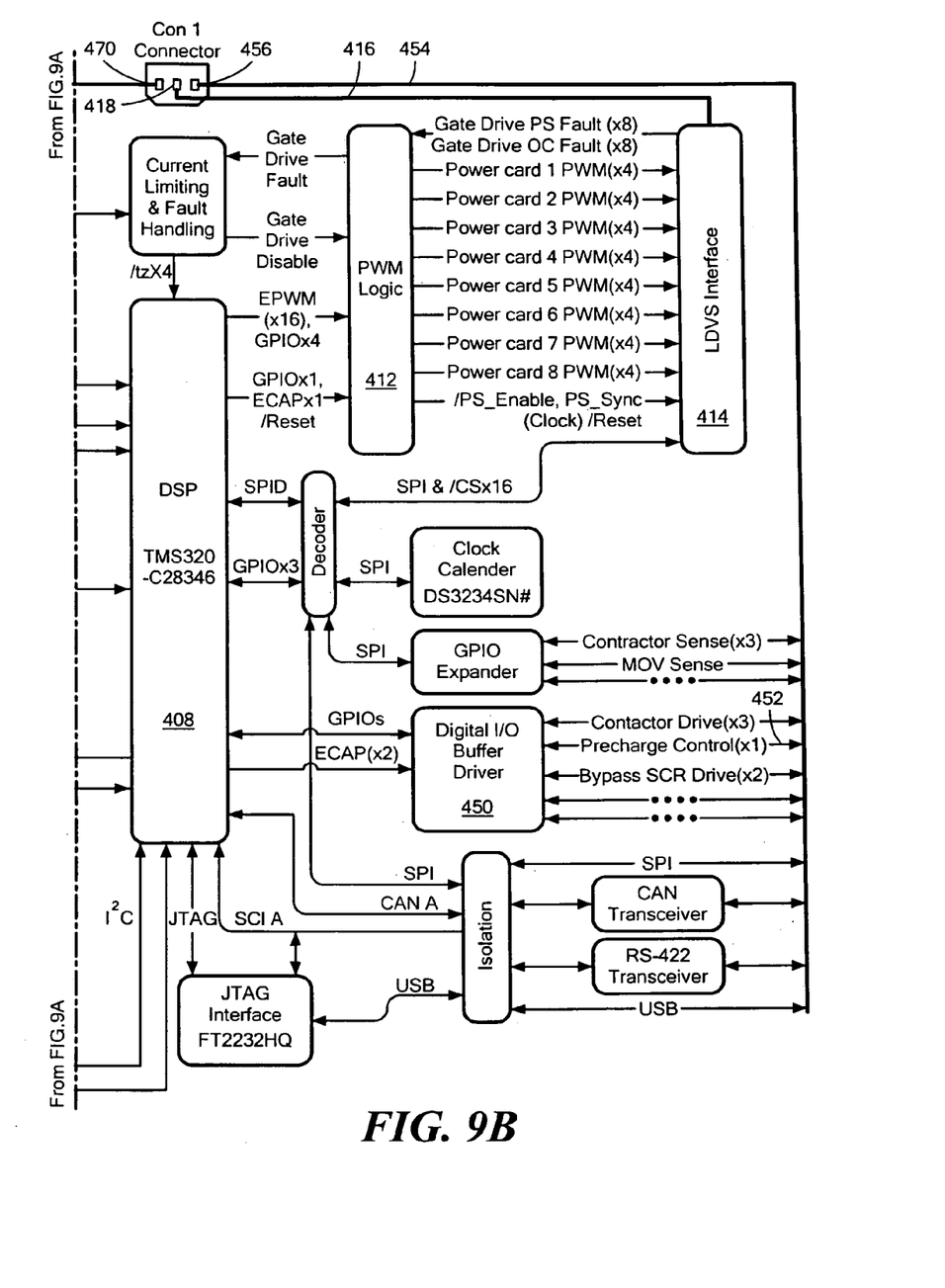

FIGS. 1, 2 and 9 is configured to sense the functional capability associated with each of the unique functional subsystems. Preferably, as shown at inputs 402, FIG. 9A, controller 18 may sense DC bus voltage of each of the power supply modules 12, FIGS. 1, 2, and 8, the current in each of the power modules 12, the current and/or voltage from the electrical input 42 and electrical output 46 and/or the temperature of system 10.

The result is modular, scalable, multi-function, power quality system 10 for utility networks shown in one or more of FIGS. 1-9B provides a modular and scalable power conditioning system from identical modules which are connected to a configurable frame with function-specific slots. This enables a customer, such as an electrical utility grid network with multiple power conditioning needs, to purchase a plurality of identical power modules and a single system frame with multiple function-specific slots to create independent scaling of power and functionality.

One or more embodiments of the modular, scalable, multi-function, power quality system for utility networks of this invention provides a modular and scalable power conditioning system that includes a plurality of identical power modules that are connected to a configurable frame having predetermined function-specific slots that define a predetermined function. A controller controls the function of the power modules in their function-specific slots such that they perform a desired predefined function. Such a design enables a customer, e.g., an electrical utility grid with multiple power conditioning needs, to purchase a plurality of identical power modules and a single system frame containing multiple function-specific slots. Such a design provides for independent scaling of power and functionality. The customer need only to estimate future power and functional needs and purchase a system with the appropriate number of pre-configured slots and a minimal set of identical power modules and populate the power modules in the appropriate functional slot. If greater function or power capability is needed, more power modules can be added.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A modular, scalable, multi-function, power quality system for utility networks, the system comprising:
    a configurable frame coupled to an electrical input and an electrical output;
    a plurality of functional slots each including a receiving connector coupled to the frame;
    one or more unique function subsystems each coupled to selected functional slots on one end and coupled only to the electrical input on the other end and one or more unique functional subsystems each coupled to selected functional slots on one end and coupled only to the electrical output on the other end, each unique function subsystem including one or more electrical components coupled to the receiving connector of selected functional slots configured to define functional capability associated with the one or more functional slots;
    a plurality of identical power modules removably disposed inside and connected to selected functional slots of each of the one or more unique function subsystems;
    a controller coupled to each of the inserted power modules configured to enable the power modules in said selected functional slots of the one or more unique function subsystems to perform a predetermined function associated with the electrical input or the electrical output.

2. The system of claim 1 in which at least one of the unique function subsystems is configured as a pre-charger module for pre-charging a DC bus for each of the plurality of identical power modules and for providing isolation.

3. The system of claim 2 in which the pre-charger subsystem includes at least a coil, a contact, a plurality of switches, and a resistor.

4. The system of claim 1 in which the at least one of the unique function subsystems is configured as a VAR injector filter module configured to provide clean power to the electrical input.

5. The system of claim 4 in which the VAR injector filter module is configured to provide input harmonic current cancellation.

6. The system of claim 4 in which the VAR injector filter module includes a filter.

7. The system of claim 4 further including a capacitive bank subsystem coupled to the VAR injector filter module configured to provide additional capacitance needed for VAR injection.

8. The system of claim 1 in which at least one of the unique function subsystems includes a power regulation filter module configured to provide filtered voltage to the electrical output.

9. The system of claim 8 in which the power filter regulation module is configured to provide output voltage harmonic cancellation.

10. The system of claim 8 in which the power regulation filter module includes an inductor and a capacitor configured as a filter.

11. The system of claim 8 further including a series injector module configured to inject regulator voltage to the output electrical port to provide power regulation and provide bypass protection during an overload or failure of the system.

12. The system of claim 11 in which the series injector module includes at least a silicon-controlled rectifier (SCR), a transformer, and a plurality of switches.

13. The system of claim 1 in which each of the plurality of power modules includes an output connector configured to connect to the receiving connector of a selected functional slot.

14. The system of claim 1 in which the controller is configured to sense the functional capability associated with each of the one or more unique functional subsystems.

15. The system of claim 1 in which the controller is configured to sense DC bus voltage of each of the power supply modules.

16. The system of claim 1 in which the controller is configured to sense the current in each of the power modules.

17. The system of claim 1 in which the controller is configured to sense the current from the electrical input.

18. The system of claim 1 in which the controller is configured to sense the current from the electrical output.

19. The system of claim 1 in which the controller is configured to sense the voltage from the electrical input.

20. The system of claim 1 in which the controller is configured to sense the voltage of the electrical input.

21. The system of claim 1 in which the controller is configured to sense the temperature of the system.

22. The system of claim 1 in which the controller is configured to control selected power modules to perform VAR injection.

23. The system of claim 1 in which the controller is configured to control selected power modules to perform harmonic current cancellation.

24. The system of claim 1 in which the controller is configured to control selected power modules to perform voltage regulation.

25. The system of claim 1 in which the controller is configured to control selected power modules to perform harmonic voltage cancellation.

26. The system of claim 1 in which each of the identical power modules includes a plurality of gate drives coupled to a plurality of switching transistors responsive to signals from the controller.

27. The system of claim of claim 26 in which the controller is configured to generate control signals to each of the power modules to activate predetermined switching transistors of the power modules.

28. The system of claim 27 in which the control signals include pulse wave modulation (PWM) signals.

29. The system of claim 1 in which the controller is configured to generate control signals to control and define the one or more unique function subsystems.

30. The system of claim 29 in which the control signals include pulse wave modulation (PWM) signals.

31. The system of claim 1 in which selected components comprising unique function subsystems are located on the one or more of the identical power modules.

32. A modular, scalable, multi-function, power quality system for utility networks, the system comprising:
- a configurable frame coupled to an electrical input and an electrical output;
- a plurality of functional slots each including a receiving connector coupled to the frame;
- a VAR injector filter module coupled to selected functional slots on one end and coupled only to the electrical input on the other end, the VAR injector filter module including one or more electrical components coupled to the receiving connector of selected functional slots configured to provide clean power to the electrical input and one or more unique functional subsystems each coupled to selected functional slots on one end and coupled only to the electrical output on the other end;
- a plurality of identical power modules removably disposed inside and connected to selected functional slots of the VAR injector filter module; and
- a controller coupled to each of the inserted power modules configured to enable the power modules in predetermined functional slots of the VAR injector filter module to provide clean power to the electrical input.

* * * * *